United States Patent [19]

Matsui

[11] Patent Number: 5,109,164
[45] Date of Patent: Apr. 28, 1992

[54] SUPERCONDUCTING WEAK LINK DEVICE
[75] Inventor: Toshiaki Matsui, Tokyo, Japan
[73] Assignee: Communications Research Laboratory Ministry of Posts and Telecommunications, Tokyo, Japan
[21] Appl. No.: 533,797
[22] Filed: Jun. 6, 1990
[30] Foreign Application Priority Data
Sep. 26, 1989 [JP] Japan .................... 1-247986
[51] Int. Cl.$^5$ ................... H03K 3/38; H03K 17/92
[52] U.S. Cl. ........................... 307/306; 357/5; 505/702; 505/729; 505/874
[58] Field of Search ............ 307/306; 357/5; 505/702, 729, 832, 874; 338/325

[56] References Cited

U.S. PATENT DOCUMENTS

| | | | |
|---|---|---|---|
| 3,522,492 | 8/1970 | Pierce | 307/306 |
| 3,553,694 | 1/1971 | Clark | 307/306 |
| 3,824,457 | 7/1974 | Strongin et al. | 307/306 |
| 4,344,052 | 8/1982 | Davidson | 307/306 |
| 4,358,783 | 11/1982 | Hebard et al. | 357/5 |
| 4,366,494 | 12/1982 | Ohta | 307/306 |
| 4,608,296 | 8/1986 | Keem et al. | 307/306 |
| 4,904,882 | 2/1990 | Szu | 307/306 |

OTHER PUBLICATIONS

T. Matsui, B. Komiyama & H. Ohta, IEEE Trans. Magn., vol. 25, 1072, 1989.

*Primary Examiner*—John Zazworsky
*Attorney, Agent, or Firm*—Oblon, Spivak, McClelland, Maier & Neustadt

[57] ABSTRACT

A superconducting weak link device includes a plurality of interconnected small superconducting regions and a plurality of conductive bridges which connect adjacent the small superconducting regions in which the length of the bridges is in the range from 1 to 5.31 times the coherence length.

3 Claims, 10 Drawing Sheets hf = 2eV

SUPERCONDUCTING WEAK LINK DEVICE

BACKGROUND OF THE INVENTION

1. Field of the Invention

This invention relates to a superconducting weak link device which links two superconductors.

2. Prior Art Statement

The Josephson effect, a specialized tunnel effect in the superconducting state, was theoretically predicted by B. D. Josephson in 1962 and experimentally verified soon thereafter. The Josephson effect had been initially thought to be a superconductive tunneling phenomenon of electron pairs occurring at a so-called tunnel Josephson junction where two superconductors are separated by a thin insulating film. Thereafter, the same Josephson effect was observed in point contact junctions where two superconductors are in contact at a point as well as in bridge-type junctions as shown in FIG. 1 in which a narrow constriction (bridge) 2 is provided on a superconducting thin film 1, leading to the development of many variations in shape. To differentiate them from tunnel junctions, the point contact junctions and bridge-type junctions are called weak link junctions, and while the former's current-voltage characteristic exhibits a large degree of hysteresis between the zero voltage state and the energy gap voltage, the latter weak-link type junctions are characterized by a current-voltage characteristic free of hysteresis as shown in FIG. 2. With tunnel junctions which have a large degree of hysteresis, it is normally difficult to set them to a voltage in the finite voltage state of $0 < V < 2\Delta/e$ using normal current-source biasing. In either case, a supercurrent flows in the zero-voltage state until the current flowing across the junction reaches a critical value and, in the nonzero-voltage state, current oscillation of a frequency proportional to the voltage, known as the ac Josephson effect, begin to occur, and if irradiated with electromagnetic waves, current steps will appear at equal voltage intervals on the current-voltage characteristic. These steps appear at voltage intervals of $hf/2e$ which is the inverse of the Josephson frequency-voltage ratio $2e/h$, a fixed unvarying fundamental constant, multiplied by the frequency f of the electromagnetic waves, where h is Planck's constant and e is the elementary electron charge. Since this step voltage can theoretically be obtained at the precision of the frequency f, this Josephson effect has found practical application in the voltage standard technology. Its sharp non-linear effect with respect to electromagnetic waves is also promising in applications to highly sensitive detection of electromagnetic waves, so research and development is proceeding continuously.

The phenomenon of electrons tunneling between the two superconductors across the barrier of the Josephson junction based on coupling of the wave functions of the electrons is understood to be caused by the wave nature of particles, but when the size of the junction becomes extremely small, the change in electrostatic energy $e^2/2C$ accompanying tunneling of an electron or electron pair (or $(2e)^2/2C$ for the case of an electron pair) is known to affect the tunnel phenomenon.

Recently, a phenomenon which has attracted much interest in physics as a new quantum effect in solid-state device has been the quantization phenomenon of tunnel current in extremely small junctions. This phenomenon is one which occurs when the particle nature of the electron dominates the tunnel effect so that the change in the electrostatic energy due to the tunneling of one particle is much greater than the coupling energy of the junction device, electrostatically blocking the tunneling of other particles (an effect called the coulomb blockade). In junctions in which this coulomb blockade acts, single electron tunneling occurs regularly at a frequency of $f = I/e$, and when a very small tunnel-type Josephson junction is operated at a constant current at low temperature ($T > e^2/k_B C$, where $k_B$ is Boltzmann's constant) regular electron-pair tunneling occurs at a frequency of $f = I/2e$. This phenomenon, variously known as single-electron-tunneling, (SET) oscillation, Bloch wave oscillation, etc., is standards and new devices which function with one electron, along with studies of its potential in new applications.

The Hamiltonian H of a very small Josephson junction biased by a current source is represented by equation (1).

$$H = \frac{(2en)^2}{2C} + E_J(1 - \cos\theta) - \frac{hI}{2e}\theta \qquad (1)$$

The first term on the right side of this equation (1) is the electrostatic energy, where n is the relative number of electron pairs, given by $n = N_2 - N_1$. The second term on the right side is the Josephson coupling energy, where $\theta$ is the phase difference, given by $\theta = \Phi_2 - \Phi_1$. The third term on the right side represents the interaction between the current I from the current source and the Josephson junction.

In Josephson junctions fabricated by typical thin-film microprocessing technology, the change in electrostatic energy $2e^2/C$ due to the tunneling of one electron pair is sufficiently small in comparison to the Josephson coupling energy $E_J$ that the first term in the right side of equation (1) is negligible and the normal Josephson effect is obtained.

This Josephson effect occurs in the bridge section 2 which connects the two superconductors 1 in FIG. 1, and in this case the length of the bridge section 2 is of particular importance. If this length is within the range of 1 to 5.31 times the coherence length of the superconductor, the current flowing within the bridge section will include a supercurrent $I_S$, and this supercurrent will not depend on of the voltage across the junction, but rather depend on the phase difference $\theta = \Phi_2 - \Phi_1$ between the phases $\Phi_1$ and $\Phi_2$ of the wave functions in the two superconductors. Since $\partial H/\partial \theta = 0$ in the equilibrium state, from equation (1), the current $I_S(\theta)$ is represented as in equation (2), $$I_S(\theta) = I_c \sin\theta \qquad (2)$$

where $I_c$ is the critical current, given by $I_c = 2eE_J/\hbar$.

The phase difference $\theta$ is related to the voltage V between the superconductors by equation (3), $$\frac{d\theta}{dt} = \frac{2eV}{\hbar} \qquad (3)$$

where $eV = \mu_2 - \mu_1$ ($\mu_1$ and $\mu_2$ are the electrochemical potentials of the respective superconductors). When voltage V is nonzero, Josephson oscillation of the junction supercurrent occurs.

Thereby, if an ac voltage of frequency $\Omega$ overlaps with the dc voltage V across the two sides of the junction, the current will contain a Fourier component of frequency 2eV/h±nf, where n is an integer. If the frequency is 2eV/h =nf for an integer n, the supercurrent will contain a dc component which depends on the phase of oscillation of the ac voltage. Hence, its dc characteristic will have a resistance portion of zero slope in the current region corresponding to the ac voltage oscillation, as in the current-voltage characteristic under irradiation of electromagnetic waves shown in FIG. 2.

Next, series connection of Josephson junctions will be described. In the case of a device in which M Josephson junctions of the same characteristics are connected in series, the junctions in the array must be considered to each have slightly different values for their junction resistance $R_k$ and critical current $I_k$ (where k=1, 2, 3 . . . M). By using a current source of sufficiently high impedance in comparison to the device resistance to apply a dc bias to this device, the common dc current is determined by the current source, and a finite voltage $V_k$ is generated at a current greater than the critical current, causing an oscillating current of frequency $f_k = 2eV_k/h$ based on the ac Josephson effect, effectively creating a system of M oscillators connected in series as shown in FIG. 3(b). While these ac current components flow as a common current, from a dc point of view the finite voltage $V_k$ is determined by the current I and the junction resistance $R_k$, so variation occurs between the frequencies $f_{k-1}$, $f_k$, $f_{k+1}$ of adjacent junctions. If there is no fluctuation in the same junction parameters, the phase differences $\theta_1$, $\theta_2$, ... $\theta_M$ will be identical, but an array in which interaction between junctions are negligible would lack a means of recovery from external perturbation, so Josephson devices linked in series are usually considered to be independent of each other.

In a purely one-dimensional system, the probability of an order defect occurring somewhere increases linearly with number M of junctions connected in series, so fluctuations as a system diverge. However, all natural one-dimensional systems are commonly weakly interacting parallel-chains, and in fact the interaction between elements intervenes, so ultimately the dynamic process of the system as a whole greatly depends on the type and strength of the interactions through these chains.

When connecting a plurality of Josephson devices of the same junction characteristics in series, if some sort of synchronizing action due to high-frequency coupling is present, oscillations due to the ac Josephson effect in M weak links in series have been reported to exhibit superimposition at roughly the same phase. In this case, the ac voltage is amplified by a factor of M and the oscillation power amplified by a factor of $M^2$. Here, the voltage $V_k$ across the junctions remains equal for a long period and perturbations are at low frequencies. Over short periods, the frequency $f_k$ of each junction is given by equation (4) and the frequencies $f_1, f_2, ... f_M$ become equal.

$$f_k = \left(\frac{1}{2\pi}\right)\left(\frac{d\theta_k}{dt}\right) = \frac{2eV}{hM} \quad (4)$$

If the Josephson devices in such a coherent state are externally irradiated by microwaves of frequency f, constant-voltage steps will appear in the current-voltage characteristic at intervals of Mhf/2e volts as shown in FIG. 3(c). However, in this case, the oscillation of each device is superimposed on the others at the same phase, but the quantum processes of the M stages are each independent so the bias voltage appears amplified by a factor of M. This is differentiated from the electromagnetic wave response characteristic of the case of a single weak link as shown in FIG. 2.

In an experiment in the 100-115 GHz band using series Josephson junctions of niobium thin film developed for use in mixers, its behavior was observed to be completely different than that of the well-known coherent operation (FIG. 3(c)) of normal series junctions. The series array devices used in the experimental research comprised Josephson junctions with short superconducting bridges of a quasi-planar-type structure; the devices were given junction resistances of 20–100 Ω in an attempt to achieve impedance matching. In the experiment, these series array junctions were biased by a voltage source circuit of much lower impedance than the junction resistance and the voltage across the ends of the array was fixed to a set dc value. The series Josephson junction array was mounted inside a quarterly reduced-height waveguide of a WR10-standard waveguide to assure highfrequency coupling. When irradiated with millimeter waves at a frequency of $\Omega/2\pi$, as in FIG. 2, a current step response unrelated to the series number M was observed at voltage intervals of $\hbar\Omega/2e$ as if the entire system was a single Josephson-junction device.

This is understood as if the pair tunneling was constrained by an action stronger than that in a coherent state, resulting in a plurality of quantum processes being interlocked in series and appearing as a single quantum process. The cause of this strong interaction within the array in this case is thought to be the synergetic effect among several factors including: that there is a strong synchronizing action of high-frequency current between the junctions due to high-frequency coupling, that the voltage across the two ends of the series array is fixed at voltage of the low-impedance dc voltage source and voltage fluctuations at low frequency is inhibited by the voltage-source biasing, and other factors.

This result can be interpreted to mean that through the strong interaction between M Josephson junctions, the quantum processes of the whole are synchronized so that an M-order multi-photon process occurs more efficiently than those of other orders. With the purpose of checking this effect in another experiment and to experimentally verify the ability of this phenomenon to be used effectively in a high-order harmonic mixer in the submillimeter wave range, high-frequency mixer experiments were carried out at different orders between ·th and 9th order between microwave local signals at 5.6-12 GHz. At an order matching the number of series stages of M=11, a relative improvement of the signal-to-noise ratio of 5 dB was obtained, demonstrating the fundamental theory. (T. Matsui, B. Komiyama & H. Ohta, IEEE Trans. Magn., Vol. 25, 1072, 1989.)

A superconductor which makes the transition to superconducting at a high temperature (critical temperature $T_c$) typically has a short coherence length $\approx$ so when forming tunnel-type Josephson junctions, the state of the thin-film surface and the quality of the interface greatly affects the junction characteristics. In particular, when using thin films of high-temperature oxide superconductors, their coherence length $\approx$ is short, being roughly the same size as the unit cell, so it is extremely difficult to create a good tunnel barrier with a thin insulating layer between superconductors.

In addition, in the case of weak-link types represented by the bridge type, in order to expect a substantially ideal Josephson effect, the length of the constriction (bridge) 2 must be shorter than 5.31 times the coherence length. Thus, when considering the process of forming various types of thin-film junctions, one encounters as many technical difficulties as in the case of the tunnel-type junction, since the qualities of the initial deposition layer of film, thin-film surface and boundaries all greatly affect the characteristics of the junctions.

OBJECT AND SUMMARY OF THE INVENTION

The object of the present invention is to provide a superconducting weak link device which has superior ultra-high-frequency response and has the critical current and junction resistance required of its intended use.

In order to achieve the above object, the superconducting weak link device of the invention comprises a plurality of small superconductors and conductive bridges of a length 5.31 times the coherence length or less which connect the small superconductors in array fashion, so that if the electron configuration between the small superconducting regions would vary from the steady state, the change in electrostatic energy would act on the pair tunneling due to the Josephson effect, thereby effecting a correction of the variation in the electron configuration and pair tunneling at weak links along a common current channel would occur continuously, so that the pair tunneling at contiguous junctions will be interlinked as a quantum process, thereby behaving as if the entire system were a single Josephson device. In this manner, by means of the invention, there is no need to accurately control the length and width of the individual superconducting bridges which are microscopic in size, but rather by accurately controlling only the width and length of the superconducting weak link array which is of a size $10^2$–$10^4$ times that of the individual bridges, a Josephson device comprising Josephson junctions of a critical current value and junction resistance suited to its intended use may be obtained.

The above and other features and objects of the invention will become apparent with the following detailed description made with reference to the drawing.

DETAILED DESCRIPTION OF THE PREFERRED EMBODIMENT

First, a theory of the invention will be described. As in the description of the prior art, in Josephson-junction series array devices, interlocking of pair tunneling over the entire series array device has been experimentally verified to appear as the quantum process of a single junction. This phenomenon is thought to be caused by the synergistic effect of the strong highfrequency coupling action and the suppression of voltage fluctuation by voltage-source biasing methods.

However, this phenomenon occurs under special experimental conditions, but it cannot be reproduced under typical conditions, such as when the same series array device is measured using a current-source biasing method, or when it is removed from the waveguide device mount. So as a result of research into how this phenomenon can be made to occur stably with good reproducibility, it was found that setting up the following conditions is effective in maintaining a strong yet stable interaction between pair tunneling in a plurality of Josephson junctions.

(a) In order to compensate for the instability to fluctuations occurring in one-dimensional arrays, interacting parallel chain systems should be combined to create redundant series-parallel arrays and thereby assure stability with respect to the order defects.

(b) The superconductors (electrodes) are weakly linked with short conductive bridges measuring $\xi$ to $5.31\xi$ in length, where $\xi$ is the coherence length of the superconductor. The voltage across the junction of the individual Josephson junctions is set by the quasiparticle current.

(c) The device shall comprise small Josephson junctions made from sufficiently small pieces of superconductor that if any variation from the steady state of electron configurations between the superconductors occurs, the electrostatic energy will change by an amount $(2en)^2/2C$ (greater than the thermal fluctuations $k_BT$; where $k_B$ is Boltzmann's constant) which is not negligible in contrast to the coupling energy of the Josephson junction.

Figure 4A:
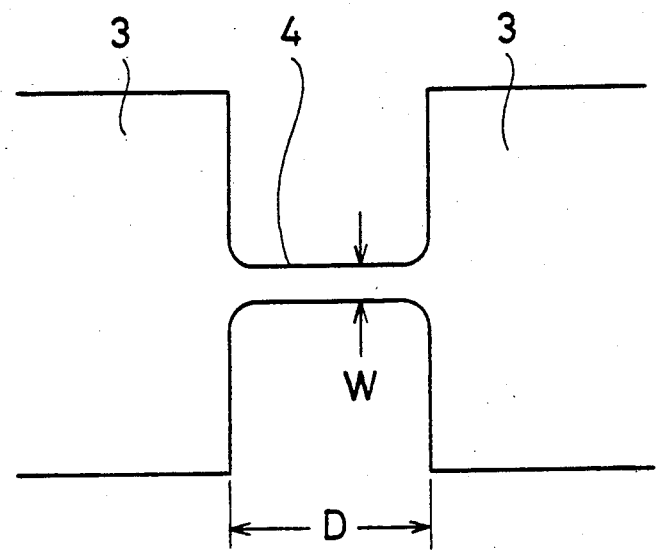
FIG. 4(a) is an explanatory diagram illustrating the superconducting weak link device of this invention which connects two superconductors.
Figure 4B:
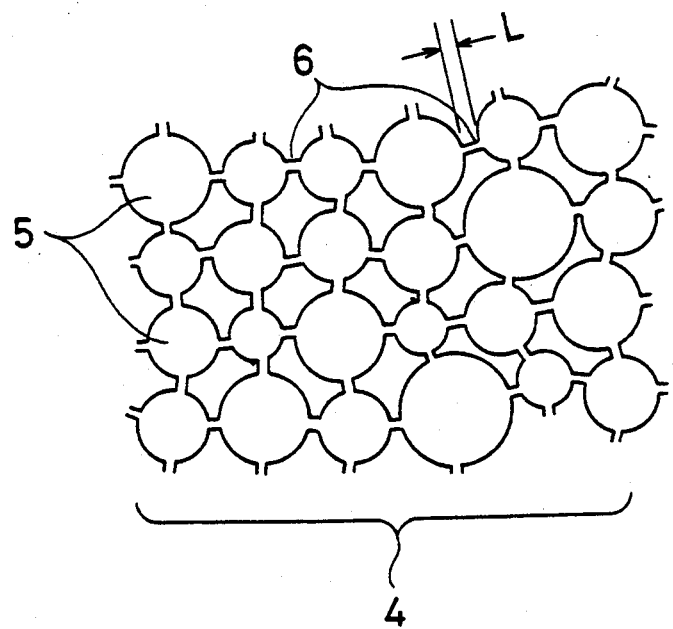
FIG. 4(b) is an enlarged portion of the explanatory diagram of the superconducting weak link device of FIG. 4(a).

FIGS. 4(a) and (b) are diagrams for explaining the basic structural concept of the superconducting weak link device of the invention based on the conditions (a), (b) and (c) above. The superconducting weak link device 4 of the invention joins two superconductors 3, and as shown in FIG. 4(b), the device 4 comprises small superconducting regions 5 and a plurality of conductive bridges 6 which interconnect these small superconducting regions 5. The length L of these bridges 6 is in the range $\xi \leq L \leq 5.31\xi$ compared to the coherence length $\xi$. The pair current across the weak link between the two superconducting regions 5 may be related to the phase difference $\theta$ roughly by the relation of equation (2), but at least the condition of being a single-valued function of the phase difference $\theta$ must be satisfied. Due to the effect of the small volume of the small superconducting regions 5 as electrodes and the effect of the small electrostatic capacity between the two electrodes, if there is any deviation in the electron configuration between the small superconducting regions 5, the change in the electrostatic energy $(2en)^2/2C$ will affect the Josephson current by the relation of equation (1). While it is not easy to give a numerical value of the electrostatic capacity since it depends on such factors of the small superconducting regions 5 including the state of its material interface, shape, arrangement and the like, if the effective volume of the small superconducting regions 5 are between $10^{-18}$ and $2 \times 10^{-12}$ cm$^3$ the effect of the invention may be obtained through the interaction of the Josephson effect and electrostatic energy.

In addition, since the small superconducting regions 5 are weakly linked by conductive bridges 6, the dc potential difference across the junction as a Josephson junction is set by the quasiparticle current.

One of the major characteristics of the superconducting weak link device 4 of the invention is that it is not a simple series-linked chain, but rather, as shown in FIG. 4(b), the series-connected junctions are arranged into parallel chains, thereby assuring interactions and consequently stability with respect to occurring of the order defects due to the fluctuations in the system as a whole. Thus exactly identical characteristics are not required of all of the small superconducting regions 5 and conductive bridges 6. A major benefit is that a superconducting weak link device 4 comprising a plurality of Josephson junctions of varying characteristics will have the characteristics of a single Josephson device, with the characteristics averaged over the whole.

A Josephson junction, depending on its intended use as a electromagnetic wave detector, mixer, oscillator, switching device, SQUID, device for generating an electromotive force reference or the like, is required to have a different optimal critical current $I_c$ and junction resistance $R_j$, but according to this invention, a high degree of homogeneity is not required of the conductive bridges 6, yet it operates as a single Josephson device. Thus by accurately adjusting the overall length D and width W of the superconducting weak link device 4 which will be between several hundred to a hundred thousand times as large as the coherence length $\xi$, the critical current $I_c$ and junction resistance $R_j$ required for its intended use may be obtained, so Josephson junctions of varying critical current and junction resistance may be easily created.

By means of the invention, there is no particular problem with respect to microlithographic techniques even if the coherence length $\xi$ is short, and since the device characteristics may be set as needed, the invention may be effectively employed as a fabrication technique for Josephson devices which use high-temperature superconductors.

Figure 5:
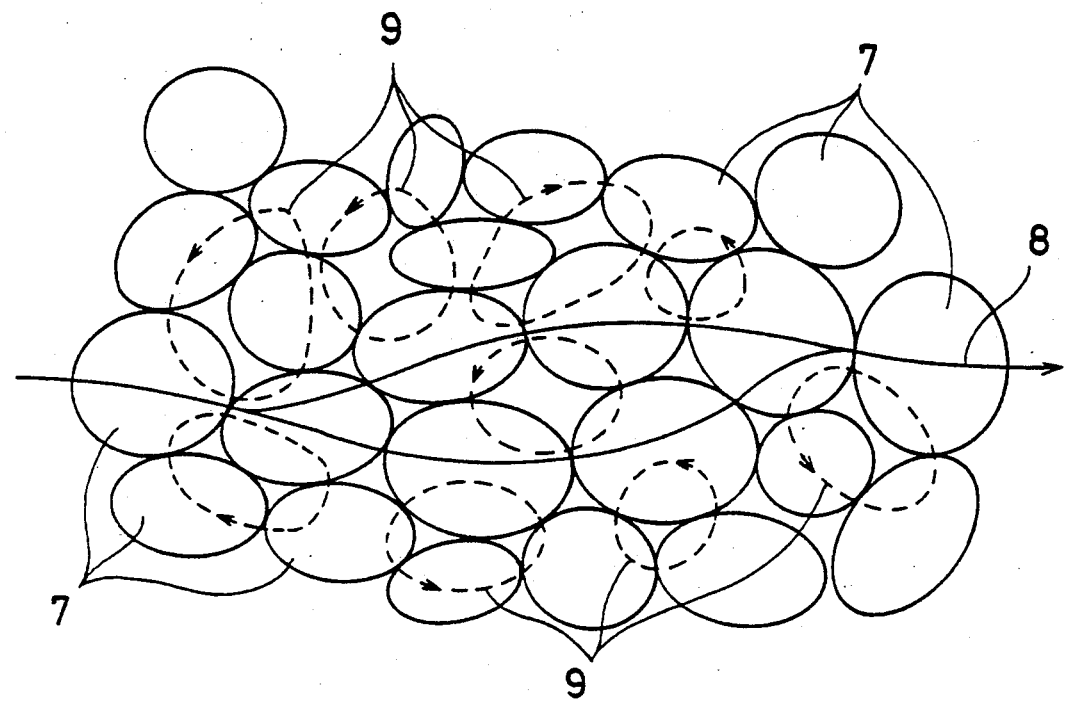
FIG. 5 is an explanatory diagram of the current distribution of the superconducting weak link device of the invention.
Figure 6:
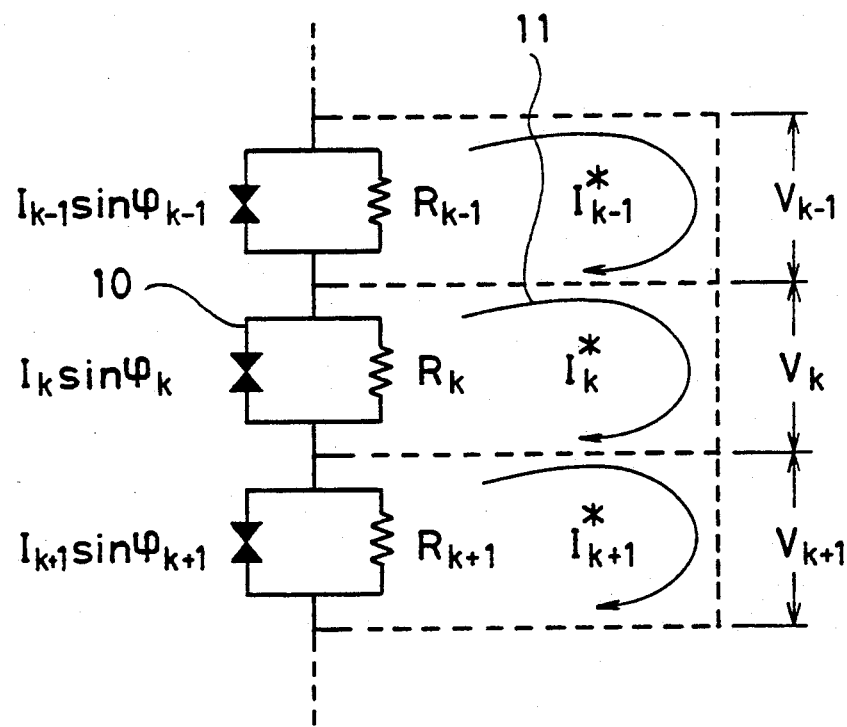
FIG. 6 is an equivalent circuit diagram of the superconducting weak link device of the invention.

The physical operation and functions of the superconducting weak link device 4 of the invention will now be described in reference to FIGS. 5 through 9. When a large number of small weak links of different characteristics form arrays among a large number of small superconducting regions in thin films, since there are differences in the resistance $R_k$ and critical current $I_k$ of each weak link, the current flowing through the bridges will not be a uniform current but rather it is thought to comprise, as shown in FIG. 5, current channels 8 which pass throughout the whole and other current loops 9. The junctions contained within the current channels 8 which pass throughout the whole become the current channels for the oscillating current due to the ac Josephson effect which occurs basically in the finite voltage state, and a common current for both the ac and dc components must flow through the current channels 8. The current loops 9 formed among the many small superconducting regions can form a current configuration which correctly maintains the overall potential differences by correcting the different junction resistances $R_k$ and critical currents $I_k$ ($k = 1, 2, 3 \ldots$) of the weak links formed among the small superconducting regions 7 connected in series along the current channels which pass throughout the whole. Since the parallel unctions can be considered together, the whole can be considered in terms of an equivalent circuit as shown in FIG. 6, assuming that the entire bridge is made up of M small weak links of slightly different junction characteristics connected in series. FIG. 6 is a representation of the kth equivalent circuit 10 along with the k$-$1th and k$+$1th equivalent circuits in front and in back of it, omitting the small capacitance of the small weak links. Here, the current loops 11 represent any links to the periphery including both the many current loops seen from the kth junction and the current loops within the microcrystalline grains forming electrodes. The compensating effect on junction parameters due to these compensatory currents $I^*_{k-1}$, $I^*_k$ and $I^*_{k+1}$ provides a uniform distribution of voltages among the junctions so $V_{k-1} = V_k = V_{k+1}$, and the current oscillation frequencies $f_{k-1}$, $f_k$ and $f_{k+1}$ are superimposed at roughly the same phase.

In this manner, in a series-parallel circuit of small weak links, even with a small amount of variation in the junction characteristics, the quasiparticle current configuration and the pair current configuration are maintained to match the phases $\theta_k$ of the weak links on the current channels 8, and also $d\theta k/dt$ by the innumerable current loops 9, and coherent behavior can be expected as if the circuit consists of junctions with almost equal characteristics and there is high frequency interaction.

Figure 7:
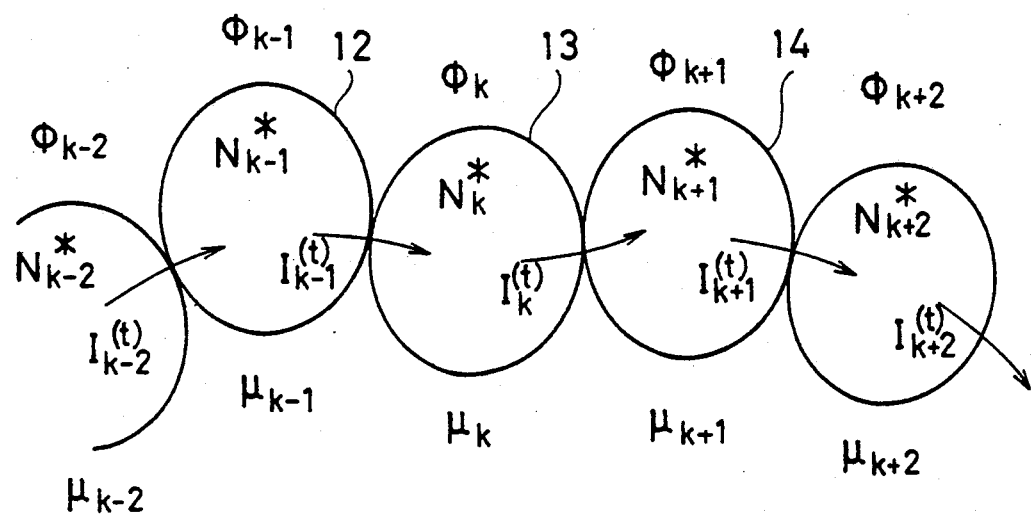
FIG. 7 is an explanatory diagram of the electron tunneling phenomenon in the superconducting weak link device of the invention.

Next, consider the effect of junctions made from small superconducting regions being coupled as a quantum process by even stronger interactions. FIG. 7 is a diagram illustrating a model for considering pair tunneling in a device made from weak links formed between small superconducting regions connected in one dimension. The diagram includes the $k-1$-th superconducting region 12, the kth superconducting region 13, the $k+1$th superconducting region 14 and other regions on either side.

The phase of the wave function of the kth superconducting region 13 is $\Phi_k$, so $$\frac{d\phi_k}{dt} = -2\mu_k \quad (5)$$

where $\mu_k$ is the electrochemical potential of the kth superconducting region 13.

If the phase difference $\theta_k$ between the kth superconducting region 13 and the $k+1$th superconducting region 14 is given as $\theta_k = \Phi_{k+1} - \Phi_k$, then the supercurrent $I_k(t)$ as $k \to k+1$, is represented as $$I_k(t) = I_{c,k} \sin\theta_k \quad (6)$$

In this case $I_{c,k-1} \approx I_{c,k} \approx I_{c,k+1}$, and the time dependence of the phase difference $\theta_k$ using equation (5) becomes $$\frac{d\theta_k}{dt} = \frac{2(\mu_{k+1} - \mu_k)}{\hbar} \quad (7)$$

In addition, the current due to motion of quasiparticles is disposed such that the mutual potential distribution is maintained to be constant, and the current is assumed to not change the number of electrons $N^*_k$ ($k=1, 2, 3 \ldots$) within each region. Therefore if the number of electron pairs in the $k-1$th and kth superconducting regions 12 and 13 are $N^*_{k-1}$ and $N^*_k$, their time dependence becomes $$2e\frac{dN^*_{k-1}}{dt} = I_k(t) - I_{k-1}(t) \quad (8)$$

$$2e\frac{dN^*_k}{dt} = I_{k+1}(t) - I_k(t)$$

since only the effect due to pair tunneling needs to be considered. As long as the time fluctuation of the relative electron-pair density $n_{k,k-1} = N^*_k - N^*_{k-1}$ between two Small superconducting regions is proportional to the relative fluctuation of the pair current flowing through the neighboring junctions, from equation (8), and therefore the movement of charge flows continuously without being disturbed, in other words, if $I_{k-1}(t) = I_k(t) = I_{k+1}(t)$ then from equation (8), there would be no change in the number of electrons within the individual superconducting regions, minimizing the electrostatic energy of the first term of equation (1). A Josephson junction array of small superconducting regions has a Josephson coupling energy $E_j$ of sufficiently dominating size, while on the other hand, when a change in the electrostatic energy due to pair tunneling effectively affects the energy of the entire system, a strong interaction is thought occur between pair tunneling over the entire array and minute variations in the electrostatic potential due to fluctuation. According to equation (1), the electrostatic energy terms increase in proportion to the square of the relative pair density $n_{k,k-1}$. As shown by equation (3), a Josephson device, even a voltage-controlled oscillator, is extremely sensitive to changes in the electrostatic potential, and in order to maintain the energy of the entire system near its minimum value, the current flowing among the weak-link type Josephson junctions between the small superconducting regions must strongly constrain each other mutually, and the instantaneous value of $I_k(t)$ ($k=1, 2, 3, \ldots$) may essentially have no degrees of freedom. In this case, the current will flow continuously with no disturbance, acting in effect to maintain the state $I_{k-1}(t) = I_k(t) = I_{k+1}(t)$ at all instants. From equation (5), this is equivalent to constraint of the degrees of freedom with respect to the phase difference $\theta_k$ ($k=1, 2, 3 \ldots$), requiring that $\theta_1 = \theta_2 = \ldots = \theta_k = \ldots$, and since this is exactly the same for the components of the oscillating current, $d\theta_1/dt = d\theta_2/dt = d\theta_k/dt$.

Figure 8A:
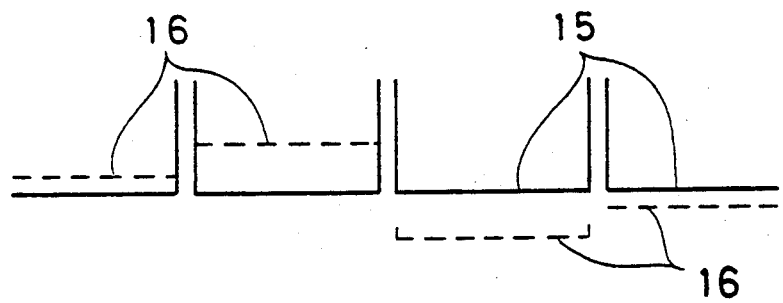
FIG. 8(a) is a potential diagram when there is no potential difference between the small superconductors.

This relationship is illustrated in FIG. 8 together with its relationship with the fluctuation of the electrochemical potentials $\mu_{k-1}$, $\mu_k$, $\mu_{k+1}$ and $\mu_{k+2}$. FIG. 8(a) is the case in which there is no dc potential difference, where the solid line indicates the potential of each electrode region in the steady state.

Here, if there is a relatively small change in the phase difference $\theta_k$ different from other junction sections, from equation (6), small changes in the current values $I_k(t)$ will occur throughout the whole, and if they are small in comparison to others, from equation (8), the pair density in the kth region 13 will increase while the pair density in the $k+1$th region 14 will decrease, resulting in displacement of the potential as shown by the dashed line 16.

Figure 8B:
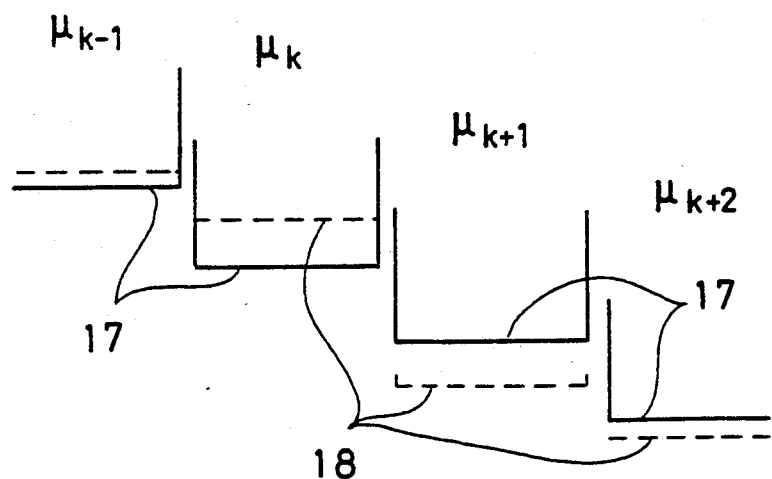
FIG. 8(b) is a potential diagram when there is a potential difference between the small superconductors.

FIG. 8(b) shows the same for the case in which a dc potential difference is present. The potential in the steady state is equally divided among the neighboring electrode regions as in the solid line 17, but in a transient state in which a change in the electron configurations occurs among the regions, a displacement in the potential distribution as shown by the dashed line 18 is thought to occur. Yet in either case, due to the strong interaction with respect to the phase difference $\theta_k$ ($k=1, 2, 3 \ldots$), the system is thought to assume a steady state as shown by the solid line 15 in FIG. 8(a) in the case of equal potentials or the solid line 17 in FIG. 8(b) in the case of a voltage difference between the ends of a bridge.

Figure 9A:
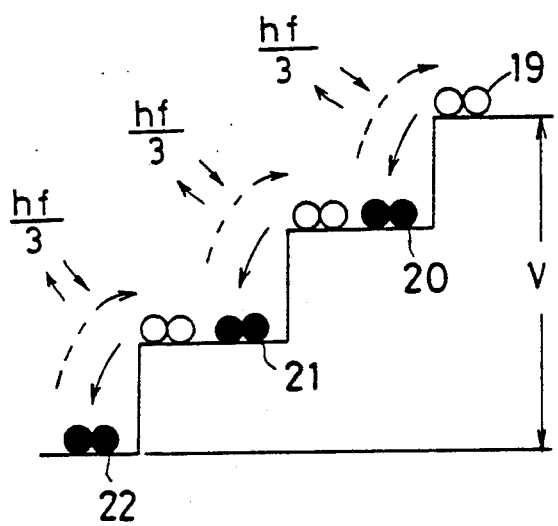
FIG. 9(a) is an explanatory diagram of the case of the prior art in which a plurality of pair tunneling processes are disposed in a cascaded potential relationship as independent quantum processes.
Figure 9B:
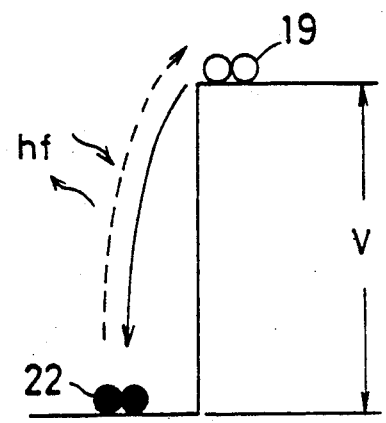
FIG. 9(b) is an explanatory diagram of the case of the present invention in which a plurality of pair tunneling processes are interlocked in a cascade potential relationship and the whole behaves as if it is a single quantum process.

When strong constriction is present in the tunnel phase of superconducting electron pairs in the manner, with respect to its quantum process, as shown in FIG. 9(a), a plurality (three) of independent quantum process acting between 19↔20, 20↔21 and 21↔22 disposed in the relationship of aligned potentials are synchronized and coupled due to the interdependence of pair tunneling caused thereby, and this is considered to appear as a quantum process equivalent to the pair tunneling between 19↔22 shown in FIG. 9(b).

Figure 1:
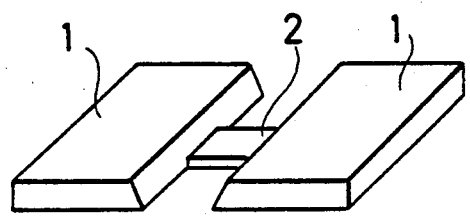
FIG. 1 is an explanatory diagram illustrating one preferred embodiment of a known superconducting weak link in which two superconductors are connected by a small bridge.
Figure 2:
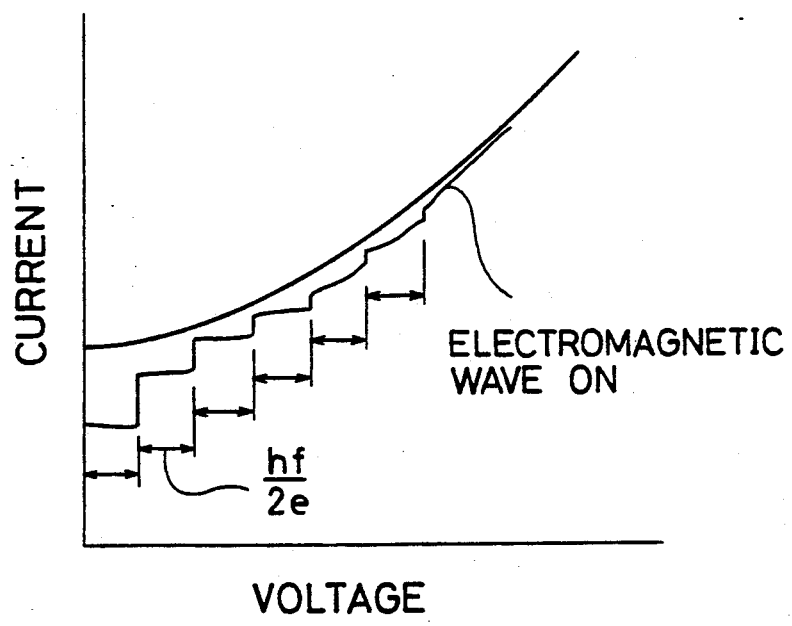
FIG. 2 is a diagram of the current-voltage characteristic of the superconducting weak link of FIG. 1.
Figure 3A:
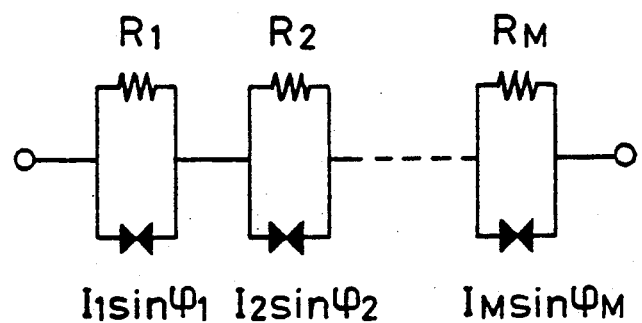
FIG. 3(a) is an equivalent circuit diagram of known series-connected Josephson junctions.
Figure 3B:
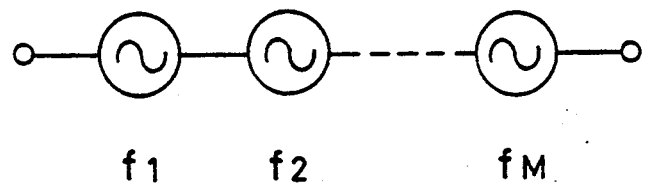
FIG. 3(b) is diagram illustrating known series-connected Josephson oscillators.
Figure 3C:
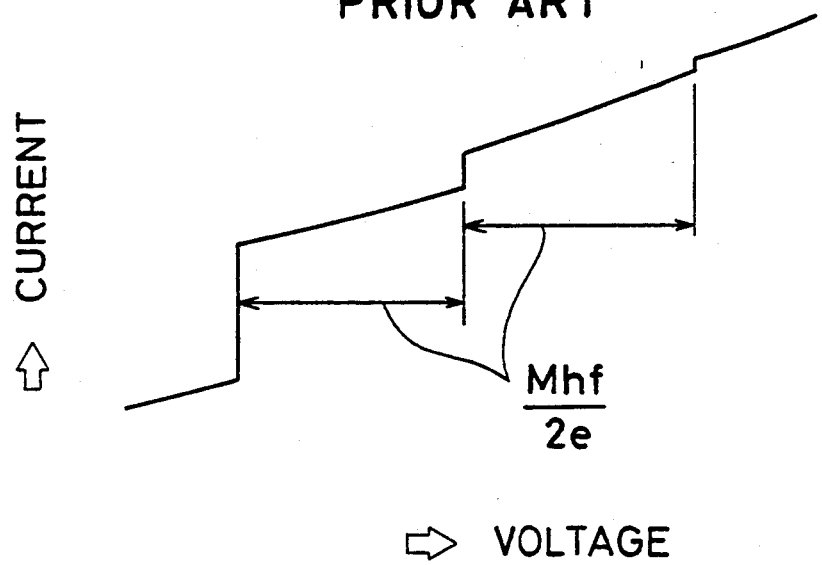
FIG. 3(c) is a diagram of the Josephson current step response characteristic when known series-connected Josephson junctions are irradiated with microwaves.

This phenomenon is fundamentally different than the current step response during coherent operation of Josephson junctions connected in series illustrated in FIG. 3(c), as an example of studies of the prior art.

When using high-temperature superconductors having short coherence lengths to form a single short weak link type Josephson junction having an extremely high-speed response characteristic of small capacitance, the state of finishing of a bridge by means of microlithography greatly affects the junction parameters, so assuring homogeneous junction characteristics with good reproducibility is extremely difficult. In contrast, by using an array of many small weak links which can be used as the equivalent of a single Josephson device, the dispersion in the parameters of individual junctions is averaged out and homogeneous junction characteristics can be obtained. Therein lies the advantage of this invention.

Figure 12:
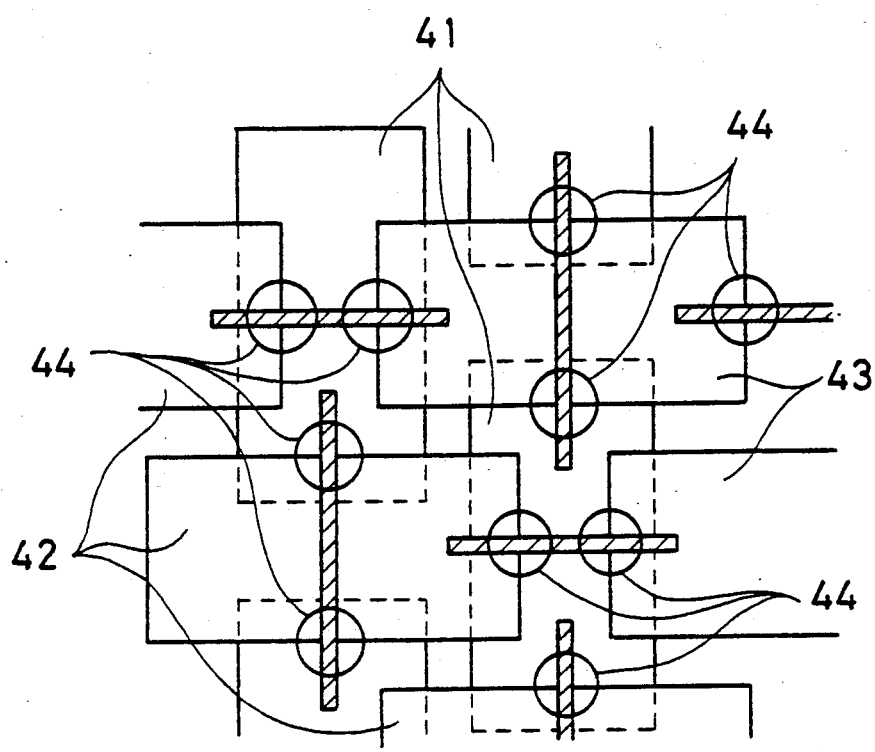
FIG. 12 is an enlarged explanatory diagram of one preferred embodiment of the superconducting weak link device of the invention.

FIG. 12 is an enlargement of a portion of a superconducting weak link device of the invention fabricated by a combination of superconducting thin-film deposition techniques and thin-film microlithographic techniques. The specific method of fabricating this device will now be described. First a superconducting thin film is grown on a substrate to form the lower electrode, and then small lower superconducting regions 41 are formed using thin-film lithographic techniques. Next an insulating thin film is grown on top of the lower electrode and another superconducting thin film is grown on top of the insulating film. The top layer is selectively exposed using a photoresist or electron-beam resist to protect the regions to become the upper superconducting regions 42 and the remainder of the unnecessary portions are removed by selective etching. In this manner, the lower regions 41 formed on the substrate and the upper regions 42 are formed electrically isolated by the insulating layer. Next, in order to weakly link the lower regions 41 and upper regions 42 by a conductive bridge material, the surface is covered with a thin superconducting film, metal film or the like and electron-beam exposure techniques or selective etching removal techniques are used to form fine, thin line-shaped conductive weak links 44. With this method, the length of the conductive bridges may be essentially set by the thickness of the insulating layer between the top and bottom superconducting films, so it is suitable for forming short superconducting weak links. When niobium is used as the superconducting thin-film material to fabricate superconducting weak link devices by the abovementioned method, superconducting regions of dimensions 2 μm wide, 4 μm long and 0.1 μm thick can be formed, while the conductive bridges measure 200 nm wide, 4-20 nm long and 10-15 nm thick. For device applications, oxide high-temperature superconductors have exhibited problems of strong anisotropism, stratified structure, short coherence length and the like. The specific method of creating a superconducting weak link device of the invention from such material will be described. In the case of an oxide high-temperature superconductor, device-fabrication processes which require creation of multilayer films are impossible with present film-forming techniques, and with fabrication methods which depend on the extreme limits of planar microlithographic technologies, due to the short coherence length $\xi$ of high-temperature superconductors, this is impossible to achieve and unrealistic. So the only conceivable method would be to form defects distributed two-dimensionally in a plane within the film in the process of forming the superconducting thin film (or before or after film-forming).

Figure 13:
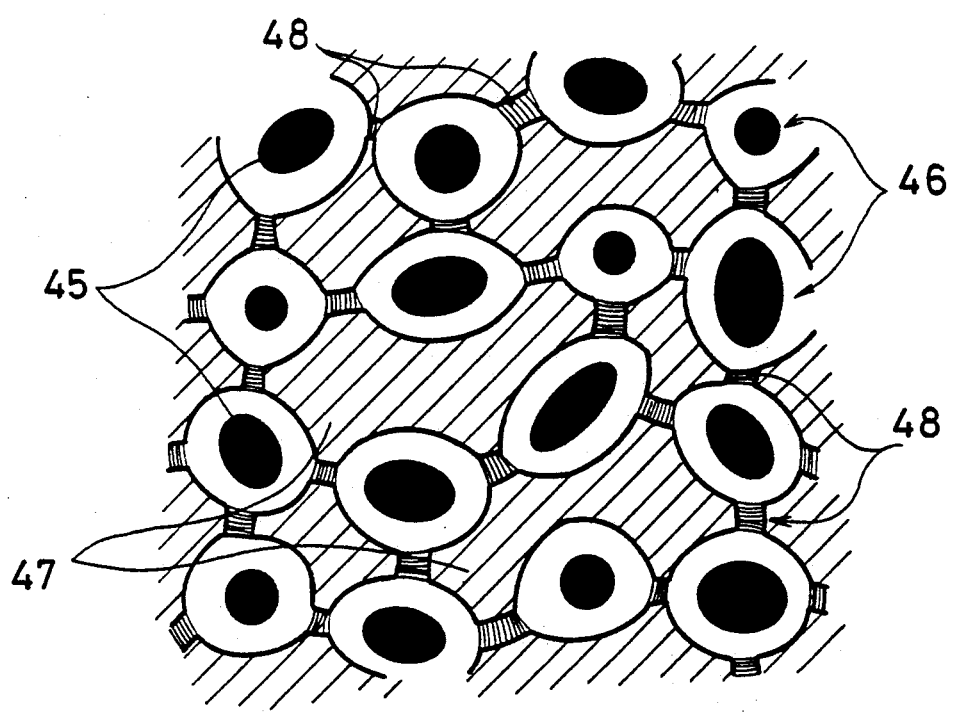
FIG. 13 is an enlarged explanatory diagram of another preferred embodiment of the superconducting weak link device of the invention.

As in FIG. 13, defects 45 distributed two-dimensionally within the film act as the centers of pinning of magnetic flux around which normally-conducting areas 46 are caused to form, resulting in an island-shaped two-dimensional distribution of small superconducting areas 47, at the boundaries between which exist weakly superconducting areas 48 which are thought to act as short superconducting weak links.

In order to create the superconducting weak link devices of the invention by distributing defects two-dimensionally throughout the film, the important factors are that the superconducting areas 47 form small superconducting regions, that the distribution of defects is roughly uniform and that the defects act strongly as pinning centers of magnetic flux. Types of defect formation include: (a) causing precipitation of excess elements and their compounds by forming the film using a ratio of constituents which is intentionally different from the basic composition and thereby distribute aggregates of atoms and their compounds roughly uniformly within the film. This type of defect is able to stably hold its magnetic flux even down to near the temperature of liquid nitrogen by its extremely strong magnetic flux pinning effect, so it is expected to be able to stably hold small superconducting regions and is usable for various types of high-temperature superconducting materials. In another viable method, (b) after growing an almost single-crystal thin film, impurities are injected to obtain a two-dimensional defect distribution, thereby the distribution of defects 45 in the superconducting thin film shown in FIG. 13 can be formed more regularly in a designed shape distribution. Toward this purpose, the ion-injection and lithography techniques used in semiconductor technology can be used effectively.

But regardless of whether the device shown in FIG. 12 is used or the distribution of defects 45 in FIG. 13 is achieved by (a) or (b) or another method, the same fundamental functions can be expected, and the superconducting weak link device of the invention can be created.

Next the results of an experiment will be described in which the superconducting weak link device of the invention was formed from a thin film of YBCO oxide high-temperature superconductor deposited by the MOCVD method.

This YBCO thin film is strongly oriented along the C axis, so microscopic grains of precipitated excess copper were distributed along one surface of the thin film; these defects in the film formed strong pinning centers of magnetic flux, forming an island-shaped distribution of superconducting regions and a two-dimensional array of Josephson junctions which weakly connected these regions.

The bridges comprising small weak links withstood several dozen thermal cycles over more than one year and were chemically stable, and furthermore, the bridges were found to have a high critical current density of $10^4$-$10^5$ A/cm$^2$. As for the Josephson junctions in the interior of the thin film, the twin-crystal portions of a YBCO thin film, for example, which are naturally-formed and distributed two-dimensionally between the microcrystalline grains are thought to act as magnetic flux pinning centers, and equivalently, a two-dimensional array of Josephson junctions is formed.

In any case, bridges in which the lengths and widths of the constriction in the thin film are different exhibited corresponding differences in their resistance $R_j$ and critical current $I_c$ values along with the same current-voltage characteristics, yet the same clear Josephson step response to microwave irradiation was observed. The bridge length D and bridge width W had dimensions three decimal places larger than the coherence length $\epsilon$, so as long as its interior does not have any microstructure which forms some sort of weak link, this is the same as a mere thin superconducting wire, so no Josephson effect will occur. In this size of superconducting thin films, observation of a step response in which vortex motion is dominant is known.

Figure 10:
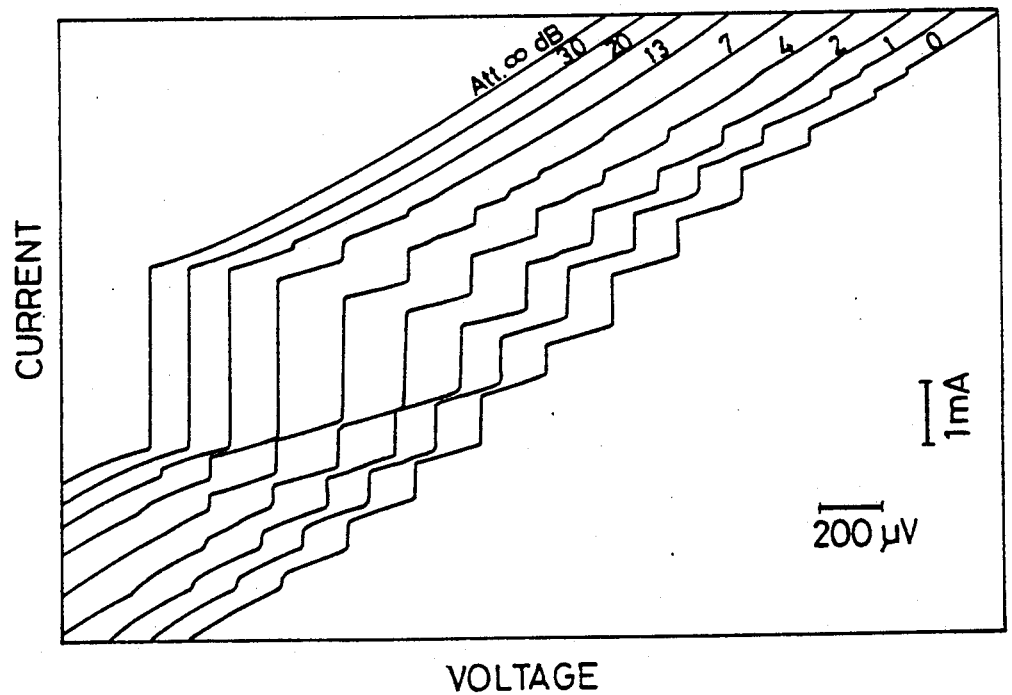
FIG. 10 is a graph of the current-voltage characteristic showing the Josephson current step response to millimeter wave irradiation when a thin film of YBCO oxide high-temperature superconductor is used as the weak link device of the invention.

A constriction (superconducting weak link device) approximately 10 $\mu m$ wide and approximately 20 $\mu m$ long using a thin film of an oxide superconductor of $Yba_2Cu_3O_7$ deposited by MOCVD was fabricated, and its response characteristic for 101 GHz and 303 GHz electromagnetic waves was measured. The resistance $R_j$ of this superconducting thin-film bridge was approximately 0.1 $\omega$ and its critical current $I_c$ was approximately 1.5 mA near 60K. FIG. 10 shows the I-V characteristic when the liquid nitrogen was depressurized, giving the device a temperature of approximately 58K. The I-V characteristic of the superconducting thin-film bridge with respect to 101 GBHz millimeter wave irradiation was measured using the four-wire method an the clear current step response due to the ac Josephson effect appeared. The current step with respect to irradiation millimeter waves of frequency f= 101 GHz appeared at a voltage intervals of hf/2e, so the I-V characteristic of a bridge comprising many small weak links appeared exactly the same as the I-V characteristic of a single weak link. Furthermore, when irradiated with submillimeter waves of a frequency of 303 GHz, three times that of 101 GHz, a primary current step appeared at the bias voltage position on the I-V characteristic corresponding to three times that when irradiated with 101 GHz, so the ac Josephson effect of a single Josephson junction was observed.

These results verified the theory that a seriesparallel weak link array formed from many small superconducting regions behaves overall as a single Josephson device.

Next, precise measurement was made of the voltage based on the ac Josephson effect of the above superconducting weak link device comprised of many small superconducting regions.

Figure 11:
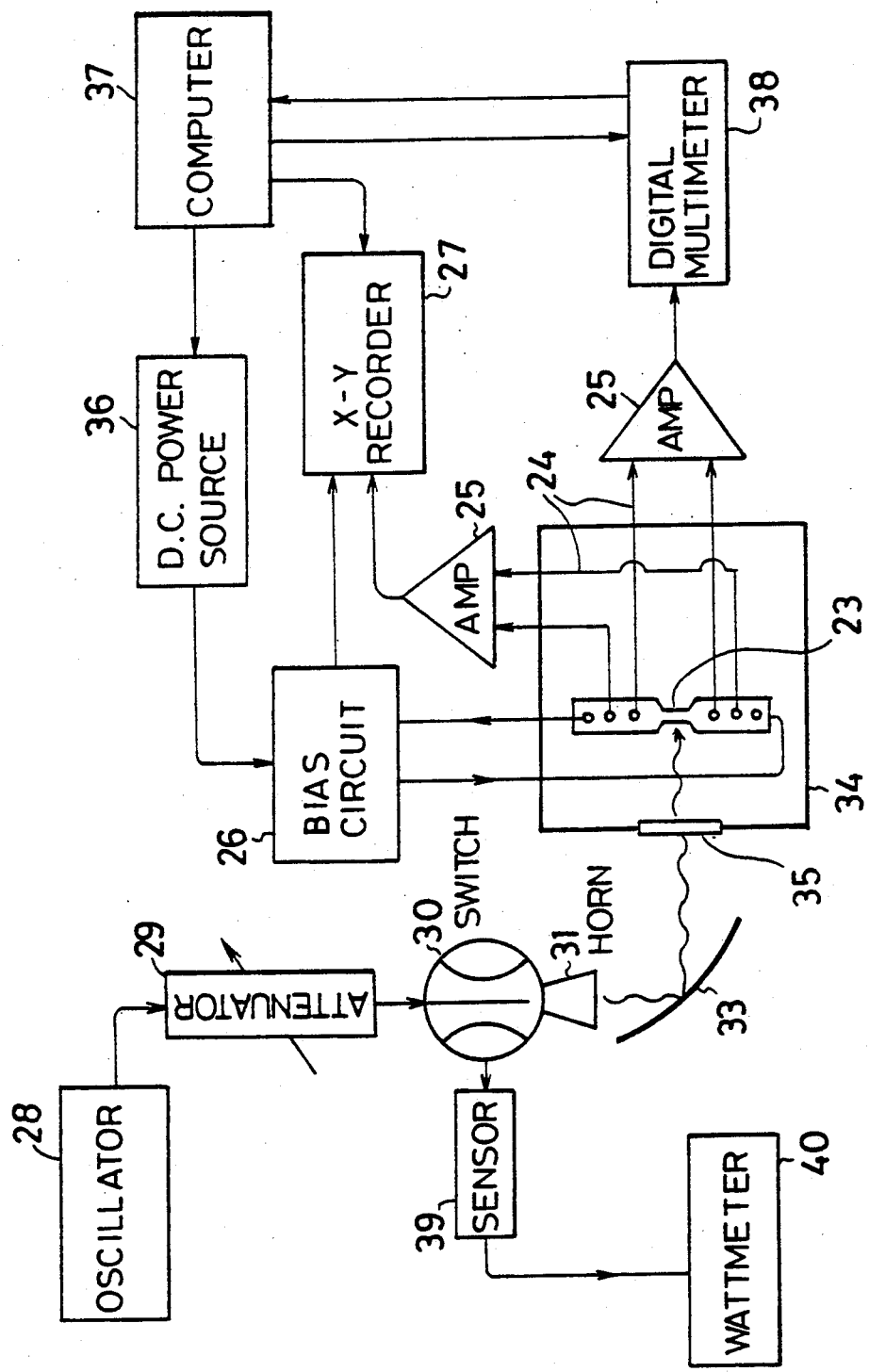
FIG. 11 is a block diagram of a measurement system for use in an experiment to evaluate the generation of a reference voltage based on the ac Josephson effect in a superconducting weak link device according to the invention.

FIG. 11 is a block diagram of the device used for the above voltage precision measurements. The YBCO weak link device 23 was mounted to a cooling Dewar 34 with a Teflon window 35, and a dc bias current from a precision dc power source 36 is supplied via a current-source bias circuit 26 to the device 23. The voltage 24 across both ends of the device 23 is amplified by a low-noise differential amplifier 25 which has a highly stable gain, arranged that the current value from the current source circuit 26 can be monitored by an X-Y recorder together with the I-V characteristic, while the voltage difference is measured with a digital multimeter 38.

Millimeter waves from a PLL millimeter wave oscillator 28 with an InP Gunn diode are sent to a horn 31 through a millimeter wave attenuator 29 and switch 30, the millimeter waves exiting from the horn 31 are focused with an aspherical mirror 33, pass through the Teflon window 35 to irradiate the device 23 inside the cooling Dewar 34. The millimeter waves sent to the horn 31 are monitored by a power sensor 39 and measured by a wattmeter 40.

In an apparatus of the above configuration, the device 23 was cooled to 63.3K by depressurization of liquid nitrogen and irradiated with millimeter waves of a frequency of 100-120 GHz, at which the voltage between the current steps generated was measured.

In order to reduce the effects of current bias fluctuations and fluctuations in the temperature of the device 23 on the slight variations of the steps, current-biasing to the central position of the current step of the order being observed is required. In practice, the precision dc power source (Systron Donner M107) 36 is controlled by a computer 37 biased on the I-V characteristic on the X-Y recorder 27, and its output voltage is set so that the output current from the current-source bias circuit 26 becomes the central current values $+I_1$ and $-I_1$ for each current step which appears at the corresponding positive and negative voltage positions $V_1$ and $-V_1$. The precision dc power source 36 was switched alternatingly 25 times in succession at 2-second intervals, at which time the voltage 24 across both ends of the bridge and the potential difference between $+V_1$ and $-V_1$ were measured with the digital multimeter (HP-3475A), read into the computer and an integrated average found. With this method, it is possible to eliminate the effect of the thermoelectromotive force $V_T$ based on the temperature difference between the device 23 and the room temperature portions and the input terminal offset voltage $V_{off}$ of the differential amplifier 25 which has a highly stable gain, to measure a value double the nth interstep voltage $V_{mn}$ multiplied by the amplifier gain G.

On the other hand, the gain G of the differential amplifier is found form the ratio of the measured values $GV_{mn}$ of the step voltage intervals and the theoretical value (nhf/2e). The temperature coefficient of the metal-film resistors used to obtain a highly stable gains is 4.5 ppm/°C. so the gain G was affected by changes in room temperature. The gain G of the amplifier varied by several ppm with temperature changes of 1-1.5° C.

In addition, the process of reading the voltage 25 times in succession at 2-second intervals to find an average value is carried out continuously to measure the equivalent input fluctuation of the amplifier. As a result, output variation due to fluctuation near nHz (low frequency) within the amplifier was seen and amplifier input drift of approximately ±4 nV was measured. With the scheme used here of symmetrically measuring the positive and negative voltages, this drift of ±4 nV at the amplifier input means that measurement errors of ±2 nV occur in the measurement of the interstep voltage of the first steps and measurement errors of ±1 nV occur in the measurement of the interstep voltage of the second steps. The results of measuring the inter-current-step voltages are listed in Table 1.

TABLE 1

| Irradiation frequency f (GHz) | Theoretical value ($\mu V$) $V_j = hf/2e$ | Step number n | Measured value ($\mu V$) $V_m$ |
|---|---|---|---|
| 100.2 | 207.176 | 1 | 207.178 |
|  |  | 2 | 207.176 |
| 105.3 | 217.721 | 1 | 217.721 |
|  |  | 2 | 217.718 |
| 110.6 | 228.680 | 1 | 228.681 |
|  |  | 2 | 228.683 |
| 114.8 | 237.364 | 1 | 237.363 |
|  |  | 2 | 237.363 |

TABLE 1-continued

| Irradiation frequency f (GHz) | Theoretical value (μV) $V_j = hf/2e$ | Step number n | Measured value (μV) $V_m$ |
|---|---|---|---|
| 119.6 | 247.288 | 1 | 247.287 |

As is evident form the table above, the measured values matched the theoretical values to within a range of error of approximately ±10 ppm for irradiation of millimeter waves at each frequency between 100-120 GHz. The error in this measured data is thought to be limited mostly to the drift in the input offset of the amplifier, variations in the amplifier gain due to temperature fluctuations, amplifier noise and external noise. The experimental results indicate that the inter-current-step voltage matches the theory very closely, and the phenomenon in this YBCO this-film bridge can be concluded to be a nearly ideal Josephson effect. In addition, these results will serve as verification for actual applications in precision voltage reference sources based on the Josephson effect, etc., which work when cooled by liquid nitrogen.

Figure 14:
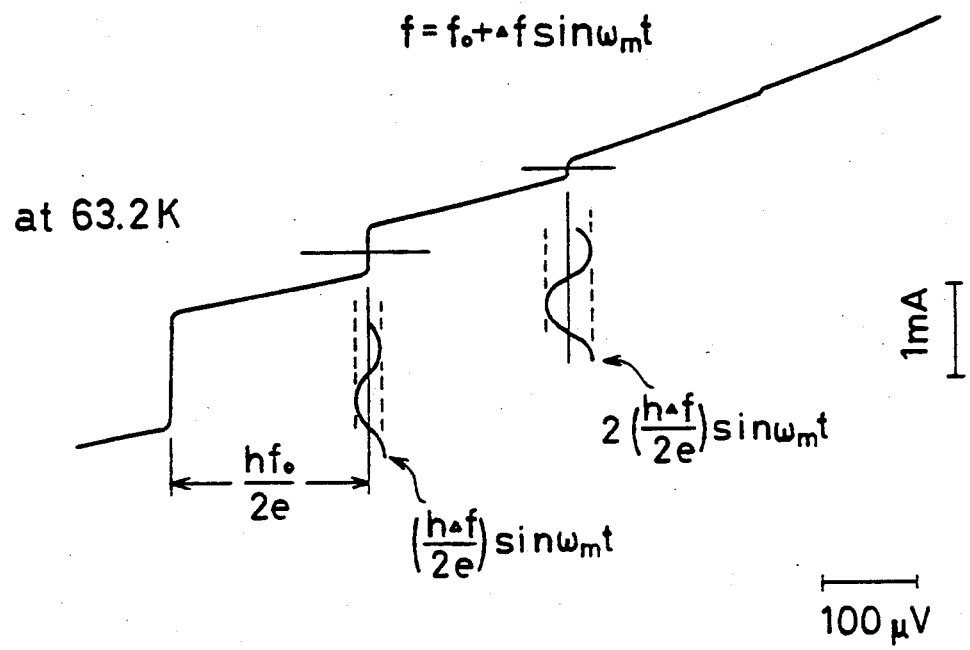
FIG. 14 is a diagram for explaining the generation of extremely high-precision low-voltage signals by means of the Josephson effect using the superconducting weak link device of the invention and a millimeter wave source.

The YBCO superconducting weak link device described above, when irradiated with electromagnetic waves of a frequency f, can generate current steps at bias voltage intervals of hf/2e, matching the Josephson effect of a single junction, but if Josephson junction devices having superior high-frequency response characteristics and high-precision frequency technologies are used, then it can generate extremely high-precision and low-noise minute voltage signals which could not be generated by any method of the prior art. When a minute amount of frequency modulation (FM) is applied to the irradiation frequency f, the step voltage will be changed by an amount proportional to the minute frequency deviation $\Delta f$ ($\Delta f < f$). If the center frequency is f3 and the modulation fraction is $f_m$, then the irradiation frequency may be set at $f = f_0 + \Delta f \sin 2\pi f_m t$, and the nth step voltage $V_n$ may be represented as $$V_n = \frac{nhf}{2e} = \left(\frac{nhf_0}{2e}\right) + \left(\frac{nh\Delta f}{2e}\right)\sin 2\pi f_m t \quad (9)$$

where n = 1, 2, 3 . . . . The first term represents the voltage of the nth step when frequency modulation is not applied, the second term represents the oscillation of the frequency $f_m$ which has a small voltage amplitude in proportion to the frequency deviation $\Delta f$. FIG. 14 graphically illustrates this relationship.

Figure 15:
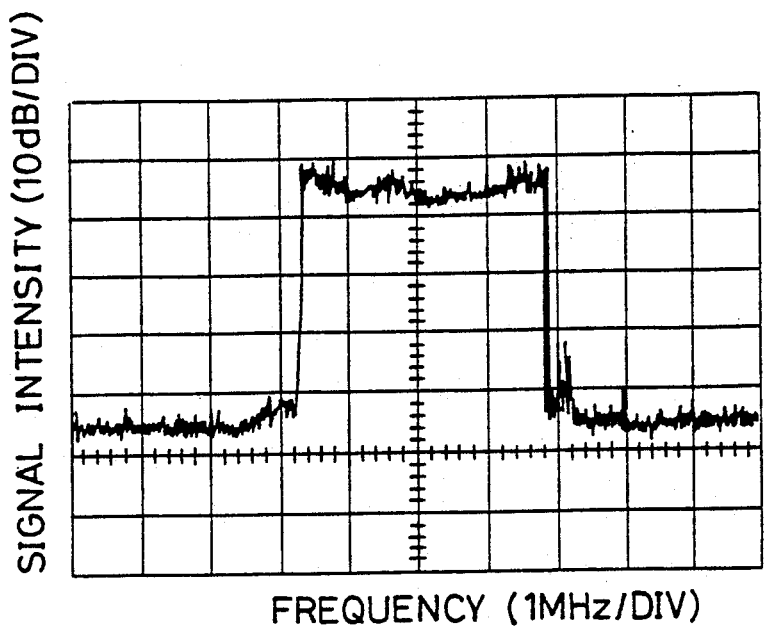
FIG. 15 is a diagram showing the spectrum of the millimeter wave signal which irradiates the superconducting weak link device of the invention in the experiment of FIG. 14.
Figure 16:
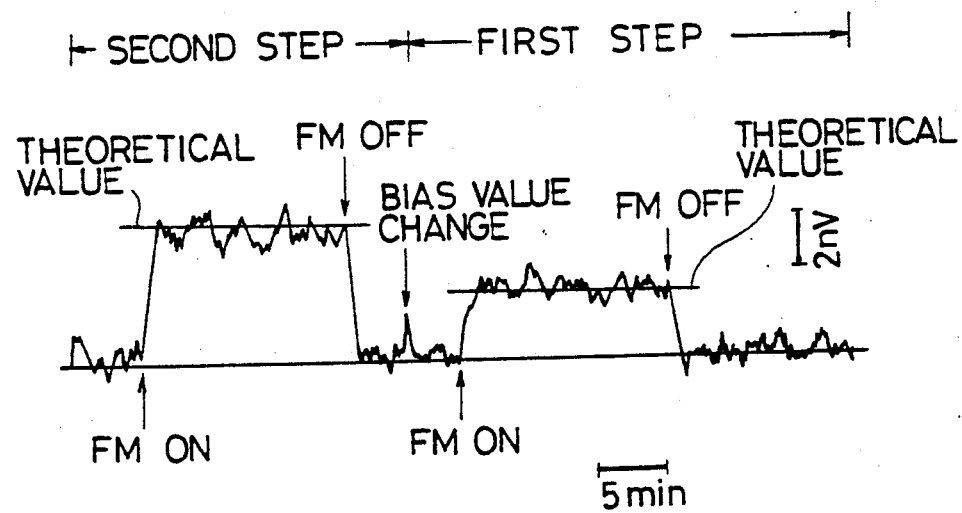
FIG. 16 is a diagram showing the frequency deviation and small voltage deviation in response to irradiation of a superconducting weak link device of the invention with the millimeter wave signal shown in FIG. 15.

In an experiment, the output of a Gunn oscillator having a center frequency $f_0 = 105.3$ GHz phase-locked to a highly stable reference frequency was given a frequency deviation of $\Delta f = 1.7$ MHz at a modulation frequency of 38 Hz and used to irradiate a YBCO weak link device cooled by depressurized liquid nitrogen and maintained at a temperature of 63.2K. FIG. 15 shows the irradiated millimeter wave spectrum measured by the external mixer of a spectrum analyzer (Tektronix 2775AP), and it is evident that a frequency deviation of ±1.7 MHz appears around a center frequency of 105.3002 GHz. At this time, the interstep voltage appearing across the ends of the bridge was amplified with synchronous phase-locking detection using a lock-in amplifier and the small voltage amplitude proportional to the frequency deviation $\Delta f$ was measured. FIG. 16 shows a comparison of the results of measuring the small voltage amplitude during frequency modulation ($\Delta f = 1.7$ MHz) oscillating about the voltage value during no modulation ($\Delta f = 0$), for both the second step and the first step after changing the current bias value. Both the small voltages of approximately 5 nV and 2.5 nV (effective values) due to the Josephson effect are detected for each.

As is apparent from the above discussion, even though the superconducting weak link device of the invention comprises a plurality of small superconducting regions joined by conductive bridges, the same behavior as a single junction can be obtained. Therefore, even without requiring the interval between superconducting regions to be set strictly between $\xi$ and $5.31\xi$ as required in the prior art, superior junction devices of uniform performance can be obtained with good reproducibility.

What is claimed is:

1. A superconducting weak link device, comprising:
   a plurality of superconducting regions formed of a superconducting material having a superconducting coherence length, each of said regions having a volume of between $10^{-18}$ and $2 \times 10^{-12}$ cubic centimeters, each of said regions being adjacent to at least one other of said regions;
   a plurality of conductive bridges which interconnect adjacent superconducting regions, the length of each said bridge being in the range of 1 to 5.31 times said coherence length.

2. A device according to claim 1, wherein:
   said superconducting regions have transition temperatures higher than the boiling temperature of liquid nitrogen.

3. A device according to claim 1, wherein:
   at least one of said superconducting regions is connected by conductive bridges to at least 2 other of said superconducting regions.

* * * * *